(12) United States Patent
Tanaka

(10) Patent No.: US 9,287,890 B2
(45) Date of Patent: Mar. 15, 2016

(54) ANALOG-TO-DIGITAL CONVERTER AND SOLID-STATE IMAGING APPARATUS

(71) Applicant: OLYMPUS CORPORATION, Tokyo (JP)

(72) Inventor: Takanori Tanaka, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 14/676,414

(22) Filed: Apr. 1, 2015

(65) Prior Publication Data

US 2015/0326241 A1 Nov. 12, 2015

Related U.S. Application Data

(63) Continuation of application No. PCT/JP2014/083331, filed on Dec. 17, 2014.

(30) Foreign Application Priority Data

May 12, 2014 (JP) ................................. 2014-098794

(51) Int. Cl.
*H03M 1/34* (2006.01)
*H04N 5/378* (2011.01)

(52) U.S. Cl.
CPC ................ *H03M 1/34* (2013.01); *H04N 5/378* (2013.01)

(58) Field of Classification Search
CPC .......... H03M 1/34; H03M 1/56; H03M 5/378
USPC ................ 250/208.1, 214 DC; 341/155–156; 348/300
See application file for complete search history.

(56) References Cited

U.S. PATENT DOCUMENTS

2006/0001624 A1* 1/2006 Lee ..................... G09G 3/3233
   345/82
2006/0120202 A1* 6/2006 Kim ....................... G09G 3/20
   365/230.06

(Continued)

FOREIGN PATENT DOCUMENTS

| JP | 2006-81203 A | 3/2006 |
| JP | 2007-281540 A | 10/2007 |
| JP | 2009-38726 A | 2/2009 |

(Continued)

OTHER PUBLICATIONS

International Search Report dated Jan. 27, 2015, issued in corresponding application No. PCT/JP2014/083331.
Written Opinion of the International Searching Authority dated Jan. 27, 2015, issued in corresponding application No. PCT/JP2014/083331.

*Primary Examiner* — Seung C Sohn
(74) *Attorney, Agent, or Firm* — Westerman, Hattori, Daniels & Adrian, LLP

(57) ABSTRACT

An analog-to-digital (AD) converter has a latch section having latch units, a capacitor, and a latch control signal line connected to the latch units. A third voltage less than a first voltage and greater than a second voltage is applied as a power supply voltage to the latch units. When the capacitor is electrically connected to the latch control signal line, a potential of the latch control signal line becomes greater than or equal to the third voltage. Only when the electrical connection between the capacitor and the latch control signal line is disconnected, the first voltage is applied to the capacitor and the second voltage is applied to the latch control signal line. When the potential of the latch control signal line becomes greater than or equal to the third voltage, the latch units latch clock signals.

5 Claims, 11 Drawing Sheets

(56) References Cited

U.S. PATENT DOCUMENTS

| | | |
|---|---|---|
| 2008/0111905 A1 | 5/2008 | Toyama et al. |
| 2010/0002019 A1* | 1/2010 | Lee .................... G09G 3/3688 345/690 |
| 2013/0162458 A1 | 6/2013 | Nishikido et al. |
| 2014/0160182 A1* | 6/2014 | Hong .................... G09G 3/3696 345/691 |

FOREIGN PATENT DOCUMENTS

| | | |
|---|---|---|
| JP | 2009-38781 A | 2/2009 |
| JP | 2013-121119 A | 6/2013 |

* cited by examiner

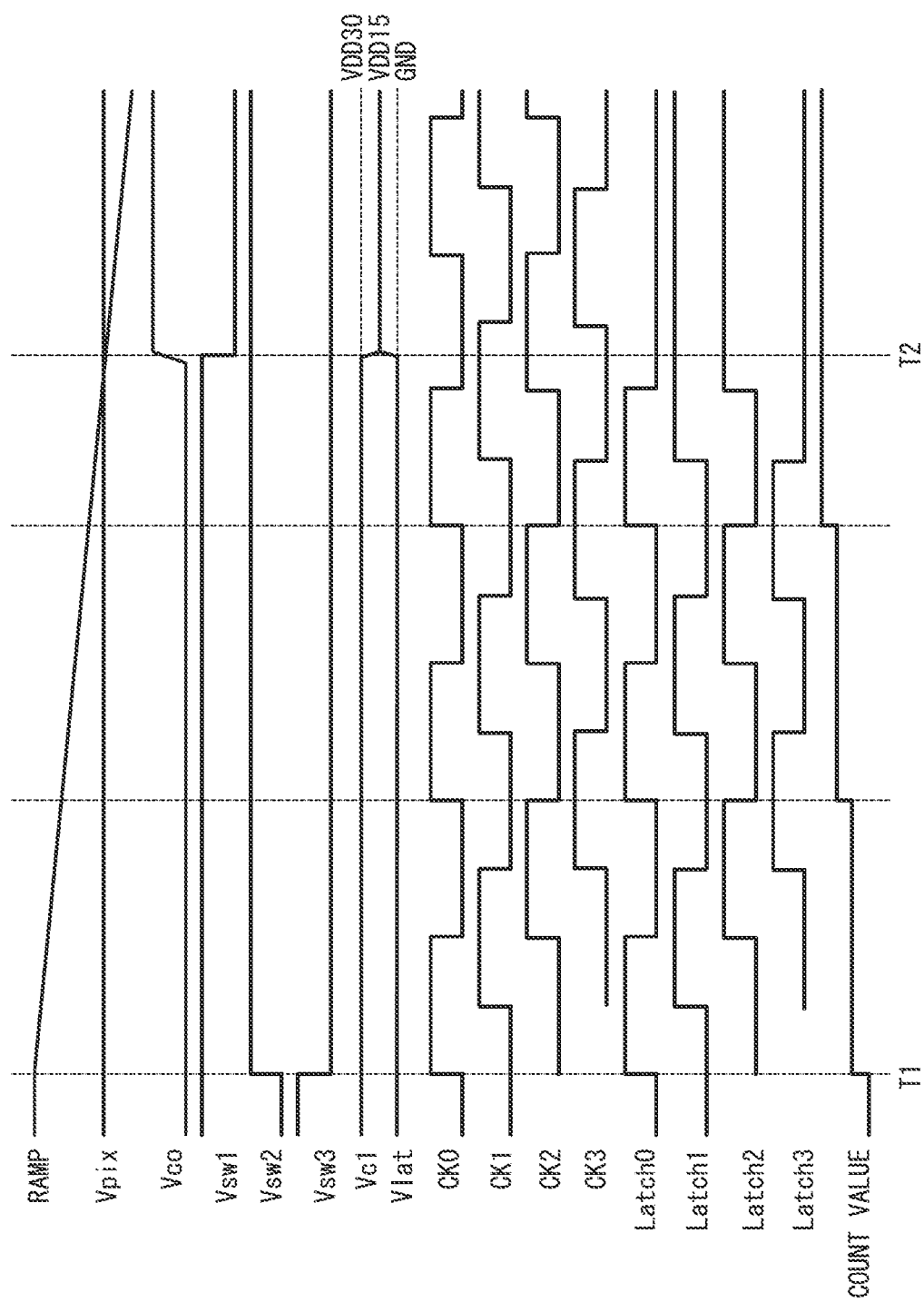

→ : DIRECTION OF CURRENT

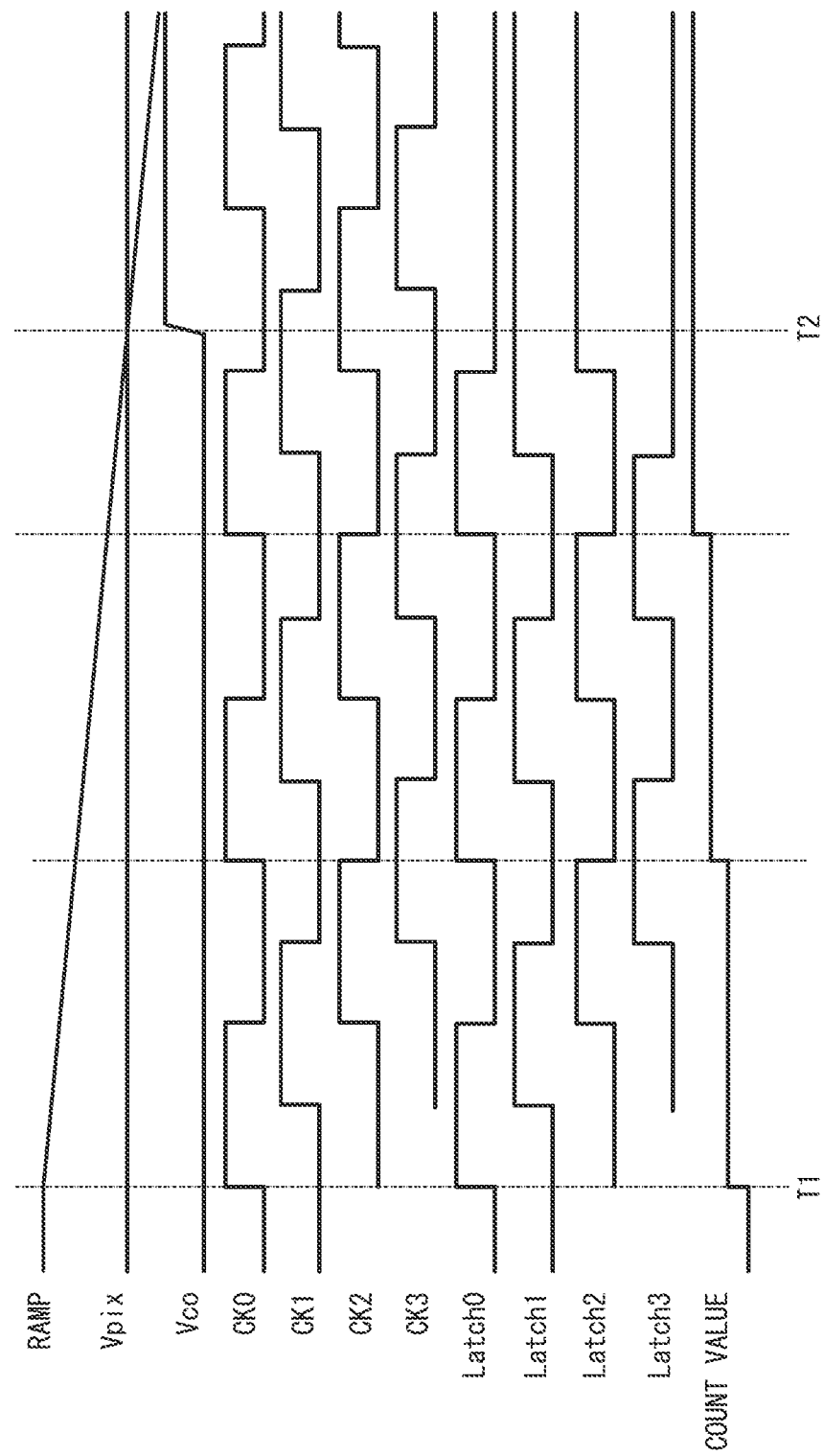

ANALOG-TO-DIGITAL CONVERTER AND SOLID-STATE IMAGING APPARATUS

This application is a continuation application based on PCT Patent Application No. PCT/JP2014/083331, filed on Dec. 17, 2014, priority of which is claimed on Japanese Patent Application No. 2014-098794, filed on May 12, 2014. The contents of both the PCT Patent Application and the Japanese Patent Application are incorporated herein by reference.

BACKGROUND OF THE INVENTION

1. Field of the Invention

The present invention relates to an analog-to-digital (AD) converter (ADC). Moreover, the present invention relates to a solid-state imaging apparatus having an AD converter and used in a digital camera, a digital video camera, an endoscope, etc.

2. Description of Related Art

As an example of an AD converter for use in a conventional solid-state imaging apparatus, an AD converter 1000 illustrated in FIG. 13 is known (for example, see the publication of Japanese Unexamined Patent Application, First Publication No. 2009-38781 and the publication of Japanese Unexamined Patent Application, First Publication No. 2009-38726). As illustrated in FIG. 13, the AD converter 1000 has a clock generation section 101, a reference signal generation section 102, a comparator 103, a latch section 104, a counter 105, and a timing control section 106.

The clock generation section 101, for example, includes a delay control circuit (delay lock loop (DLL)). The clock generation section 101 generates a plurality of clock signals (multi-phase clocks) CK0 to CK3 having different phases from each other. The reference signal generation section 102 generates a reference signal RAMP whose level changes in an inclined shape with the passage of time in synchronization with an output of the clock generation section 101.

The comparator 103 receives a pixel signal Vpix serving as a target of time detection and the reference signal RAMP and outputs a comparison signal Vco which is a pulse signal having a magnitude (pulse width) of a time axis direction corresponding to a magnitude of the pixel signal Vpix. The comparator 103 is connected to power supply wiring 109 through which a power supply voltage Vdd is applied.

The latch section 104, for example, has a plurality of latch units 107 constituted of D-latches. The plurality of latch units 107 are connected to the comparator 103 through the latch control signal line 108. The plurality of latch units 107 receive the comparison signal Vco from the comparator 103 and latch the clock signals CK0 to CK3 at the timing at which the comparison signal Vco is inverted.

The counter 105 performs a count operation based on a signal Latch0 output from one latch unit 107 of the latch section 104. The signal Latch0 is a signal output from the latch unit 107 to which the clock signal CK0 is input from the clock generation section 101 and is a signal equivalent to the clock signal CK0.

Next, an operation of the AD converter 1000 will be described using FIG. 14. FIG. 14 illustrates an operation example of the AD converter 1000. In FIG. 14, the reference signal RAMP, the pixel signal Vpix, the comparison signal Vco, the clock signals CK0 to CK3, signals Latch0 to Latch3, and a count value are illustrated. The signals Latch0 to Latch3 indicate states of signals inside four latch units 107 to which the clock signals CK0 to CK3 are input. The horizontal direction of FIG. 14 represents time. In addition, the vertical direction of FIG. 14 represents a voltage for each signal excluding the count value.

First, at a timing T1 related to an operation start, the clock generation section 101 starts an operation. Thereby, the reference signal generation section 102 starts an output of the reference signal RAMP. The clock signals CK0 to CK3 from the clock generation section 101 are input to the latch units 107. One latch unit 107 outputs the clock signal CK0 as the signal Latch0 to the counter 105. The counter 105 performs the count operation based on the signal Latch0. In the example illustrated in FIG. 14, the counter 105 performs the count operation at a rising edge of the signal Latch0.

At the timing T1, the level of the reference signal RAMP is higher than the level of the pixel signal Vpix. After the timing T1, the level of the reference signal RAMP decreases with the passage of time. At the timing T2 at which the level of the reference signal RAMP is lower than the level of the pixel signal Vpix, the level of the comparison signal Vco from the comparator 103 is inverted from a Low level to a High level. Thereby, the plurality of latch units 107 hold states of the clock signals CK0 to CK3. The plurality of latch units 107 hold the states of the clock signals CK0 to CK3 and therefore the counter 105 holds the count value.

As described above, the AD converter 1000 obtains digital data corresponding to the magnitude of the pixel signal Vpix. The digital data includes the count value held by the counter 105 and the states of the clock signals CK0 to CK3 held by the plurality of latch units 107.

SUMMARY OF THE INVENTION

According to a first aspect of the present invention, an analog-to-digital (AD) converter includes: a reference signal generation section configured to generate a reference signal that increases or decreases with a passage of time; a comparator configured to compare an analog signal with the reference signal and generate a comparison signal at a timing at which the reference signal satisfies a predetermined condition with respect to the analog signal; a clock generation section configured to generate a plurality of clock signals having different phases from each other; a latch section having a plurality of latch units corresponding to the plurality of clock signals, each of the plurality of latch units being configured to latch one corresponding clock signal of the plurality of clock signals; a capacitor to which a first voltage is applied; a latch control signal line to which a second voltage less than the first voltage is applied and which is connected to the plurality of latch units; a first switch configured to control an electrical connection between the capacitor and the latch control signal line based on a control signal; and a selection circuit configured to output the control signal for electrically connecting the capacitor to the latch control signal line, only when the comparison signal has been generated. A third voltage less than the first voltage and greater than the second voltage is applied as a power supply voltage to the plurality of latch units. When the capacitor is electrically connected to the latch control signal line, a potential of the latch control signal line becomes greater than or equal to the third voltage. Only when the electrical connection between the capacitor and the latch control signal line is disconnected, the first voltage is applied to the capacitor and the second voltage is applied to the latch control signal line. When the potential of the latch control signal line becomes greater than or equal to the third voltage, the plurality of latch units latch the plurality of clock signals.

According to a second aspect of the present invention, in the AD converter according to the first aspect of the present invention, a distance between the first switch and the selection circuit may be less than a distance between a latch unit closest to the selection circuit among the plurality of latch units and the selection unit.

According to a third aspect of the present invention, the AD converter according to the first or second aspect of the present invention may further include: a second switch configured to control an electrical connection between the first voltage and the capacitor; and a third switch configured to control an electrical connection between the second voltage and the latch control signal line.

According to a fourth aspect of the present invention, in the AD converter according to any one of the first to third aspects of the present invention, the number of the latch units may be set to be a power of 2.

According to a fifth aspect of the present invention, a solid-state imaging apparatus may include: a pixel section in which a plurality of pixels, each of which has a photoelectric conversion element and outputs a pixel signal, are disposed in a matrix; and the AD converter according to claim 1. A configuration of the AD converter excluding the reference signal generation section and the clock generation section may be provided for every one or more columns of an array of the plurality of pixels.

BRIEF DESCRIPTION OF THE DRAWINGS

FIG. 4 is a timing chart illustrating an operation example of the ADC provided in the solid-state imaging apparatus according to the embodiment of the present invention.

FIG. 14 is a timing chart illustrating an operation example of the conventional ADC.

DETAILED DESCRIPTION OF THE INVENTION

Figure 1:
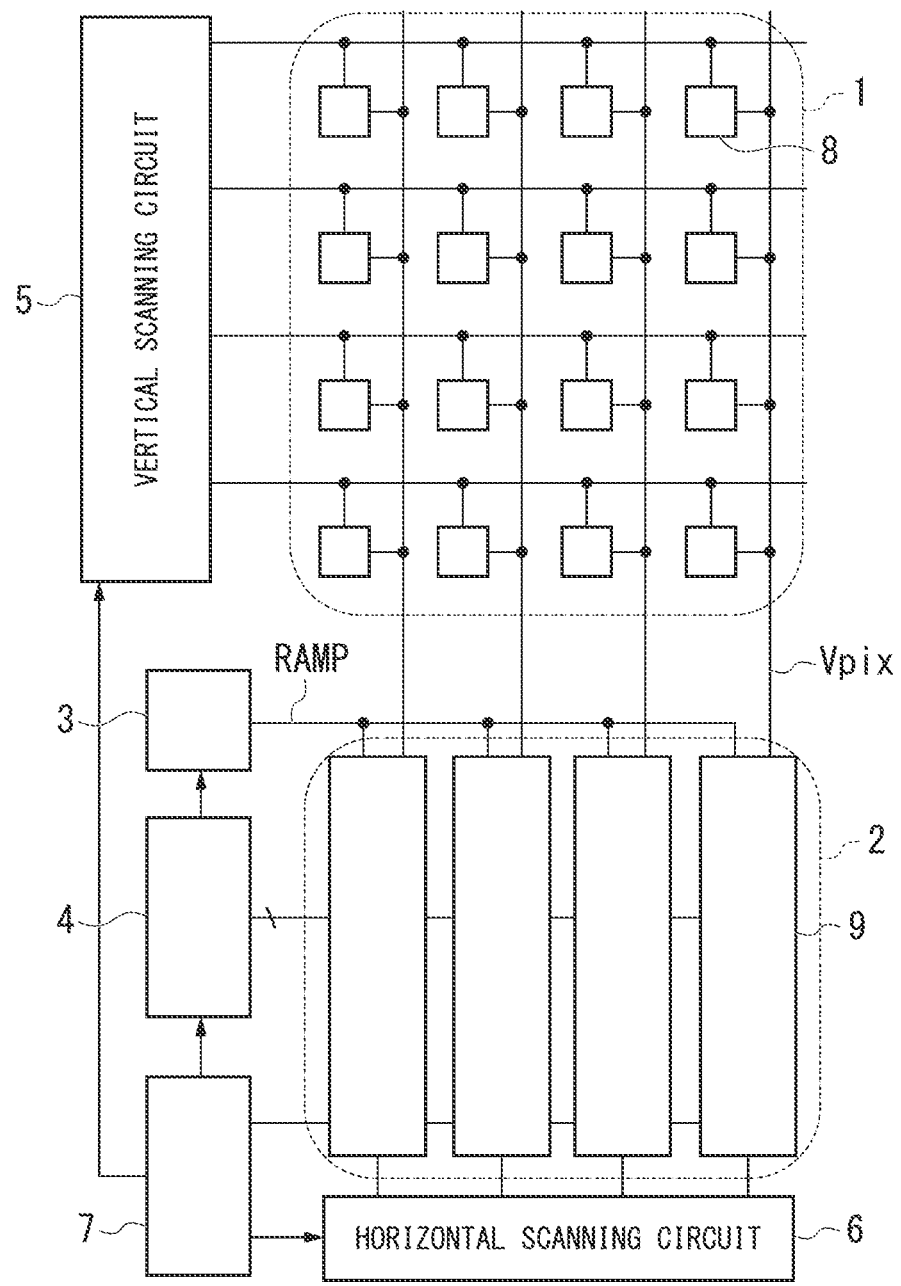
FIG. 1 is a block diagram illustrating a configuration example of a solid-state imaging apparatus according to an embodiment of the present invention.

Hereinafter, embodiments of the present invention will be described with reference to the drawings. FIG. 1 illustrates a configuration example of a solid-state imaging apparatus 100 according to an embodiment of the present invention. As illustrated in FIG. 1, the solid-state imaging apparatus 100 has a pixel section 1, an ADC section 2, a reference signal generation section 3, a clock generation section 4, a vertical scanning circuit 5, a horizontal scanning circuit 6, and a timing control section 7.

The pixel section 1 has a plurality of pixels 8. Each of the plurality of pixels 8 has a photoelectric conversion element, generates a pixel signal Vpix corresponding to an intensity of light incident on the photoelectric conversion element, and outputs the generated pixel signal Vpix. In the pixel section 1, the plurality of pixels 8 are disposed in a matrix. Although 16 pixels 8 in 4 rows and 4 columns are illustrated in FIG. 1, it is only necessary for the number of rows and the number of columns to be two or more.

The ADC section 2 has a plurality of ADCs 9. Each of the plurality of ADCs 9 converts the pixel signal Vpix output from the pixel 8 in accordance with AD conversion and obtains digital data corresponding to a magnitude of the pixel signal Vpix. Each of the plurality of ADCs 9 is provided for one column of the array of the plurality of pixels 8. Each of the plurality of ADCs 9 may be provided for a plurality of columns of the array of the plurality of pixels 8. That is, each of the plurality of ADCs 9 may process the pixel signals Vpix output from the pixels 8 of the plurality of columns.

The reference signal generation section 3 includes a digital-to-analog converter (DAC), an integral circuit, or the like. The reference signal generation section 3 generates a reference signal RAMP that increases or decreases with the passage of time.

The clock generation section 4 includes a delay locked loop (DLL), a voltage controlled oscillator (VCO), or the like. The clock generation section 4 generates a plurality of clock signals having different phases from each other. In this embodiment, the clock generation section 4 generates four clock signals.

The vertical scanning circuit 5 includes a shift register, a decoder, or the like. The vertical scanning circuit 5 generates a control signal for driving the plurality of pixels 8 for every row and outputs the generated control signal to the pixels 8 of each row.

The horizontal scanning circuit 6 includes a shift register, a decoder, or the like. The horizontal scanning circuit 6 reads digital data from the ADC 9 of each column. The read digital data is output from the solid-state imaging apparatus 100.

The timing control section 7 includes a timing generator or the like. The timing control section 7 generates a control signal for controlling the ADC section 2, the clock generation section 4, the vertical scanning circuit 5, and the horizontal scanning circuit 6, and outputs the generated control signal to the ADC section 2, the clock generation section 4, the vertical scanning circuit 5, and the horizontal scanning circuit 6.

In the solid-state imaging apparatus 100, the reference signal generation section 3, the clock generation section 4, and the ADC 9 constitute an AD converter according to this embodiment.

Figure 2:
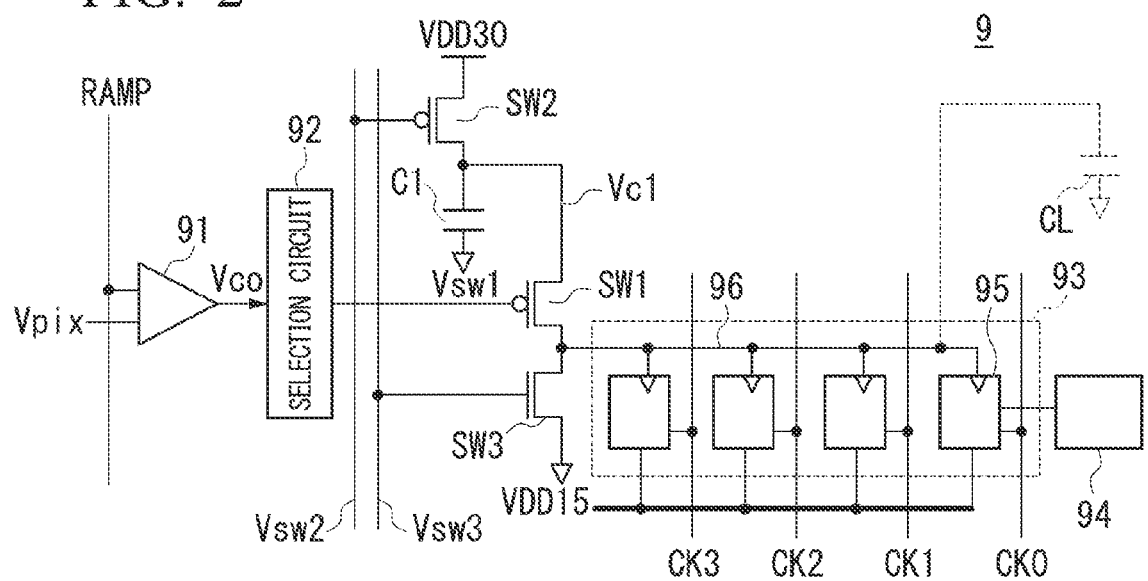
FIG. 2 is a block diagram illustrating a configuration example of an ADC provided in the solid-state imaging apparatus according to the embodiment of the present invention.

FIG. 2 illustrates a configuration example of the ADC 9. In FIG. 2, the horizontal direction is a column direction of the array of the plurality of pixels 8. As illustrated in FIG. 2, the ADC 9 has a comparator 91, a selection circuit 92, a latch section 93, a counter 94, a first switch SW1, a second switch SW2, a third switch SW3, and a capacitor C1.

The comparator 91 compares a pixel signal Vpix that is an analog signal with a reference signal RAMP and generates a comparison signal Vco at a timing at which the reference signal RAMP satisfies a predetermined condition with respect to the pixel signal Vpix. The predetermined condition is that a magnitude relationship between levels of the pixel signal Vpix and the reference signal RAMP be switched. For example, before the predetermined condition is satisfied, the comparison signal Vco is in an invalid state of a Low level. In an example in which the reference signal RAMP decreases with the passage of time, the level of the reference signal RAMP is greater than the level of the pixel signal Vpix at the timing at which the comparator 91 has started the comparison. The comparison signal Vco is in the valid state of the High level at a timing at which the level of the reference signal RAMP is lower than the level of the pixel signal Vpix. On the other hand, in an example in which the reference signal RAMP increases with the passage of time, the level of the reference signal RAMP is less than the level of the pixel signal Vpix at the timing at which the comparator 91 has started the comparison. The comparison signal Vco is in the valid state of the High level at a timing at which the level of the reference signal RAMP is greater than the level of the pixel signal Vpix.

Figure 3:
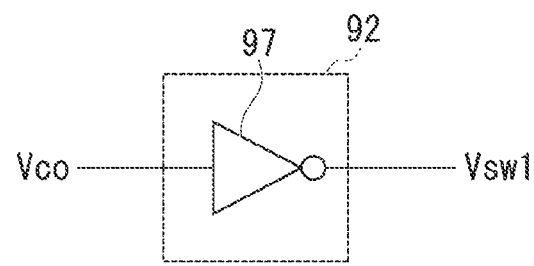
FIG. 3 is a circuit diagram illustrating a configuration example of a selection circuit in the ADC provided in the solid-state imaging apparatus according to the embodiment of the present invention.

The selection circuit 92 generates a first control signal Vsw1 for controlling the first switch SW1 based on the comparison signal Vco output from the comparator 91. FIG. 3 illustrates a configuration example of the selection circuit 92. As illustrated in FIG. 3, the selection circuit 92 has an inverter circuit 97 (inverting circuit). The inverter circuit 97 generates the first control signal Vsw1 by inverting the comparison signal Vco and outputs the generated first control signal Vsw1. The configuration of the selection circuit 92 is not limited to the configuration illustrated in FIG. 3. It is only necessary for a circuit constituting the selection circuit 92 to be a circuit capable of generating the first control signal Vsw1 for controlling the first switch SW1.

The latch section 93 has a plurality of latch units 95 corresponding to a plurality of clock signals CK0 to CK3 generated by the clock generation section 4. Each of the plurality of latch units 95 latches one corresponding signal of the plurality of clock signals CK0 to CK3. The plurality of latch units 95 are connected to the latch control signal line 96. In addition, a voltage VDD15 (third voltage) is applied to the plurality of latch units 95 as a power supply voltage of the plurality of latch units 95. The voltage VDD15 is less than the voltage VDD30 to be described below and greater than the ground voltage. For example, the voltage VDD15 is 1.5 V. The plurality of latch units 95 latch the plurality of clock signals CK0 to CK3 when a potential of the latch control signal line 96 is greater than or equal to the voltage VDD15 applied as the power supply voltage.

The counter 94 performs a count operation based on a signal output from one latch unit 95 of the latch section 93. In this embodiment, the counter 94 performs the count operation based on a signal, which is equivalent to the clock signal CK0, output from the latch unit 95 to which the clock signal CK0 is input. In FIG. 2, a circuit for holding a count value which is a result of the count operation performed by the counter 94 is not illustrated. For example, the counter 94 may also be used as a holding circuit for holding a count value, by employing the counter having a latch function as the counter 94.

The first switch SW1 and the second switch SW2 include P-channel metal oxide semiconductor (PMOS) transistors. In addition, the third switch SW3 includes an N-channel metal oxide semiconductor (NMOS) transistor.

A gate of the first switch SW1 is connected to the selection circuit 92. The first control signal Vsw1 output from the selection circuit 92 is input to the gate of the first switch SW1. A drain of the first switch SW1 is connected to a source of the second switch SW2 and a first end of the capacitor C1.

The first switch SW1 controls an electrical connection between the capacitor C1 and the latch control signal line 96 based on the first control signal Vsw1. Specifically, when the level of the first control signal Vsw1 is Low, the first switch SW1 is in an ON state, and the capacitor C1 and the latch control signal line 96 are electrically connected. In addition, when the level of the first control signal Vsw1 is High, the first switch SW1 is in an OFF state, and the electrical connection between the capacitor C1 and the latch control signal line 96 is disconnected.

The gate of the second switch SW2 is connected to the timing control section 7. The timing control section 7 outputs a second control signal Vsw2 for controlling the second switch SW2. The second control signal Vsw2 output from the timing control section 7 is input to the gate of the second switch SW2. The source of the second switch SW2 is connected to a voltage source (not illustrated) that outputs a voltage VDD30. The voltage VDD30 output from the voltage source is applied to the source of the second switch SW2. For example, the voltage VDD30 is 3.0 V. The drain of the second switch SW2 is connected to the first end of the capacitor C1 and the source of the first switch SW1.

The second switch SW2 controls the electrical connection between the voltage VDD30 (first voltage) and the capacitor C1 by controlling the electrical connection between the voltage source that outputs the voltage VDD30 and the capacitor C1. Specifically, when the level of the second control signal Vsw2 is Low, the second switch SW2 is in the ON state, and the voltage VDD30 and the capacitor C1 are electrically connected. In addition, when the level of the second control signal Vsw2 is High, the second switch SW2 is in an OFF state, and the electrical connection between the voltage VDD30 and the capacitor C1 is disconnected.

The capacitor C1 is a capacitor having first and second ends. The voltage VDD30 output from the voltage source is applied to the capacitor C1 via the second switch SW2. The second end of the capacitor C1 is connected to a ground terminal to which a ground voltage is supplied. The ground voltage is applied to the second end of the capacitor C1. Hereinafter, description will be given under the assumption that a capacitance value of the capacitor C1 is the same as a capacitance value of a load capacitor CL of the latch control signal line 96. The load capacitor CL is a parasitic capacitor added to wiring, a transistor, or the like.

The gate of the third switch SW3 is connected to the timing control section 7. The timing control section 7 outputs a third control signal Vsw3 for controlling the third switch SW3. The third control signal Vsw3 output from the timing control section 7 is input to the gate of the third switch SW3. The drain of the third switch SW3 is connected to the drain of the first switch SW1 and the latch control signal line 96. The source of the third switch SW3 is connected to the ground terminal. The ground voltage is applied to the source of the third switch SW3.

The third switch SW3 controls an electrical connection between the ground voltage (second voltage) and the latch control signal line 96 by controlling the electrical connection between the ground terminal and the latch control signal line 96. Specifically, when the level of the third control signal Vsw3 is High, the third switch SW3 is in the ON state, and the ground voltage and the latch control signal line 96 are electrically connected. In addition, when the level of the third control signal Vsw3 is Low, the third switch SW3 is in the OFF state, and the electrical connection between the ground voltage and the latch control signal line 96 is disconnected.

The ground voltage applied to the source of the third switch SW3 and the second end of the capacitor C1 may be a predetermined voltage output by a predetermined voltage source and lower than the voltage VDD15. It is possible to further simplify a configuration by controlling the electrical connection within the ADC 9 using the first switch SW1, the second switch SW2, and the third switch SW3.

Next, the operation of the ADC 9 will be described. FIG. 4 illustrates an operation example of the ADC 9. In FIG. 4, the reference signal RAMP, the pixel signal Vpix, the comparison signal Vco, the first control signal Vsw1, the second control signal Vsw2, the third control signal Vsw3, a voltage Vc1 of the first end of the capacitor C1, the potential Vlat of the latch control signal line 96, the clock signals CK0 to CK3, the signals Latch0 to Latch3, and the count value are illustrated. The signals Latch0 to Latch3 indicate states of signals inside the four latch units 95 to which the clock signals CK0 to CK3 are input. The horizontal direction of FIG. 4 represents time. In addition, the vertical direction of FIG. 4 represents a voltage for each signal excluding the count value.

Before a timing T1, the level of the comparison signal Vco is Low. Thus, the selection circuit 92 outputs the first control signal Vsw1 of the High level. Thus, the first switch SW1 is in the OFF state and the electrical connection between the capacitor C1 and the latch control signal line 96 is disconnected.

In addition, before the timing T1, the level of the second control signal Vsw2 is Low. Thus, the second switch SW2 is in the ON state and electrically connects the voltage VDD30 and the capacitor C1. Thereby, because the voltage VDD30 is applied to the first end of the capacitor C1, the voltage Vc1 of the first end of the capacitor C1 is the voltage VDD30.

In addition, before the timing T1, the level of the third control signal Vsw3 is High. Thus, the third switch SW3 is in the ON state and electrically connects the ground voltage and the latch control signal line 96. Thereby, because the ground voltage is applied to the latch control signal line 96, the potential Vlat of the latch control signal line 96 is a ground voltage GND.

At the timing T1, the reference signal generation section 3 starts the generation of the reference signal RAMP and the comparator 91 starts the comparison between the reference signal RAMP and the pixel signal Vpix. At the timing T1, the level of the reference signal RAMP is greater than the level of the pixel signal Vpix.

In addition, at the timing T1, the level of the second control signal Vsw2 changes from the Low level to the High level. Thus, the second switch SW2 is in the OFF state and disconnects the electrical connection between the voltage VDD30 and the capacitor C1. The voltage Vc1 of the first end of the capacitor C1 is maintained at the voltage VDD30.

In addition, at the timing T1, the level of the third control signal Vsw3 changes from the High level to the Low level. Thus, the third switch SW3 is in the OFF state and disconnects the electrical connection between the ground voltage and the latch control signal line 96. The potential Vlat of the latch control signal line 96 is maintained at the ground voltage GND.

After the timing T1, the reference signal RAMP decreases with the passage of time. In addition, the clock signals CK0 to CK3 output from the clock generation section 4 are input to the plurality of latch units 95 of the latch section 93. The latch unit 95 to which the clock signal CK0 is input outputs the input clock signal CK0 as the count clock of the counter 94. The counter 94 performs a count operation based on the signal output from the latch unit 95. A count value of the counter 94 is incremented at the timing of rising of the clock signal CK0.

When the level of the reference signal RAMP is less than the level of the pixel signal Vpix at the timing T2, that is, when the magnitude relationship between the levels of the pixel signal Vpix and the reference signal RAMP is switched, the comparator 91 outputs the comparison signal Vco of the High level. That is, the level of the comparison signal Vco changes from the Low level to the High level.

Thereby, the selection circuit 92 outputs the first control signal Vsw1 of the Low level. Thus, the first switch SW1 is in the ON state and electrically connects the capacitor C1 and the latch control signal line 96. At this time, the potential Vlat of the latch control signal line 96 changes from the ground voltage GND to an intermediate voltage, that is, the voltage VDD15, between the voltage Vc1 of the first end of the capacitor C1, that is, the voltage VDD30, and the ground voltage GND. Because the power supply voltage of the plurality of latch units 95 is the voltage VDD15, the potential Vlat of the latch control signal line 96 is the voltage VDD15, so that the plurality of latch units 95 latch the plurality of clock signals CK0 to CK3. Details of the change in the potential Vlat of the latch control signal line 96 will be described below.

The plurality of latch units 95 latch the clock signals CK0 to CK3, so that the counter 94 latches the count value.

As described above, the voltage VDD30 is applied to the capacitor C1 and the ground voltage is applied to the latch control signal line 96 only when the electrical connection between the capacitor C1 and the latch control signal line 96 is disconnected. In addition, the selection circuit 92 outputs the first control signal Vsw1 for electrically connecting the capacitor C1 and the latch control signal line 96 only when the predetermined condition is satisfied in the comparator 91 and the comparison signal Vco is generated. Thereby, at the timing T2, the potential Vlat of the latch control signal line 96 becomes the voltage VDD15. That is, when the capacitor C1 and the latch control signal line 96 are electrically connected, the potential of the latch control signal line 96 is greater than or equal to the power supply voltage of the plurality of latch units 95. Thus, at the timing T2, the plurality of latch units 95 latch the plurality of clock signals CK0 to CK3.

In the operation illustrated in FIG. 4, at the timing T1, the second switch SW2 is in the OFF state and disconnects the electrical connection between the voltage VDD30 and the capacitor C1. In addition, in the operation illustrated in FIG. 4, at the timing T1, the third switch SW3 is in the OFF state and disconnects the electrical connection between the ground voltage and the latch control signal line 96. The timing at which the second switch SW2 is in the OFF state and the timing at which the third switch SW3 is in the OFF state may be the timings before the timing T2 at which the level of the comparison signal Vco changes from the Low level to the High level.

Figure 5A:
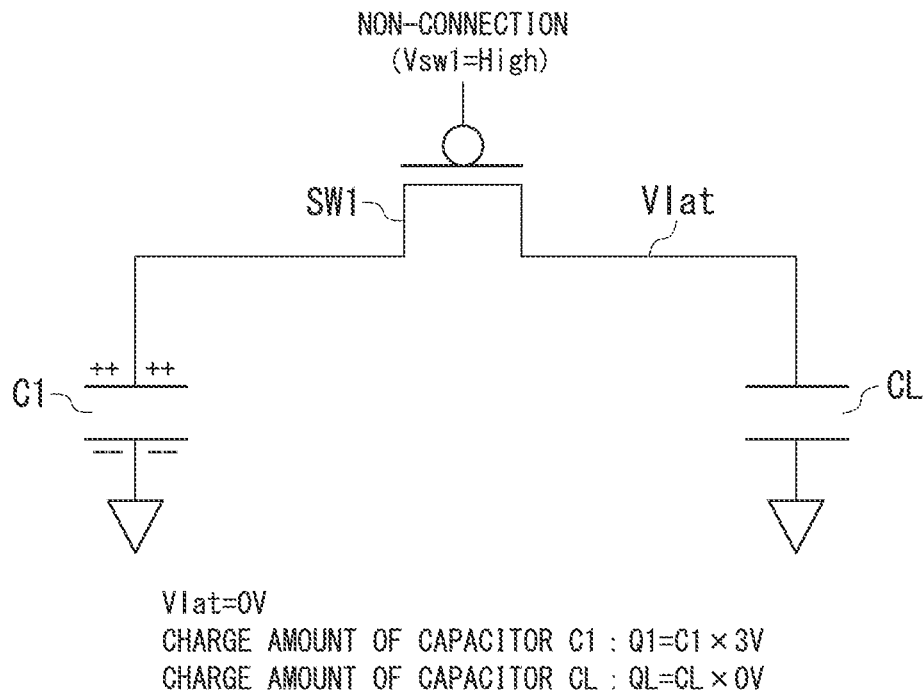
FIG. 5A is a reference diagram illustrating a change in a potential of a latch control signal line in the ADC provided in the solid-state imaging apparatus according to the embodiment of the present invention.
Figure 5B:
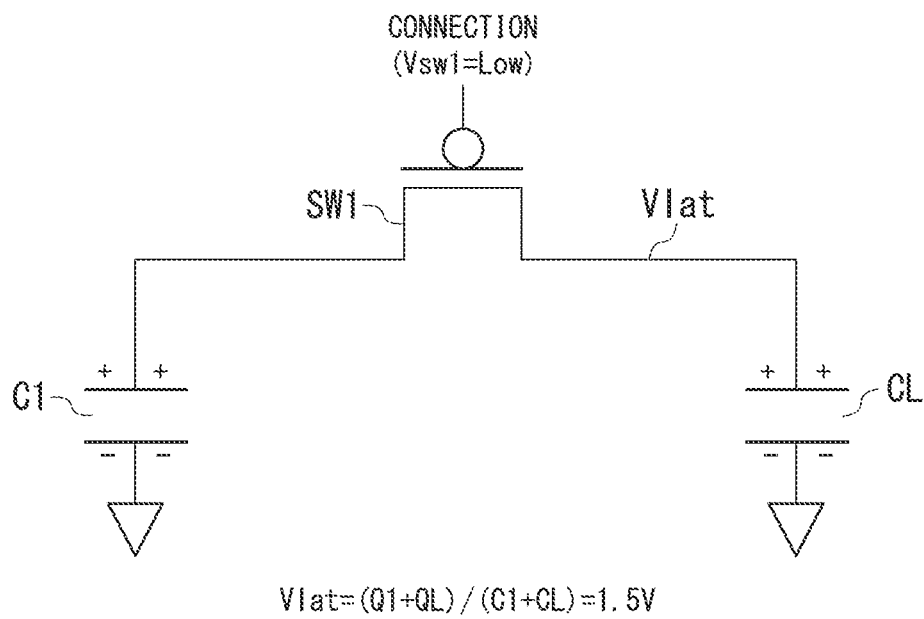
FIG. 5B is a reference diagram illustrating a change in the potential of the latch control signal line in the ADC provided in the solid-state imaging apparatus according to the embodiment of the present invention.

FIGS. 5A and 5B illustrate a change in the potential Vlat of the latch control signal line 96. FIG. 5A illustrates a state of the potential Vlat of the latch control signal line 96 when the level of the first control signal Vsw1 is High. Because the level of the first control signal Vsw1 is High, the first switch SW1 is in the OFF state. Thus, the capacitor C1 and the latch control signal line 96 are not electrically connected. As described above, the voltage VDD30 is applied to the capacitor C1. Because the voltage VDD30 is 3 V, a charge amount Q1 of the capacitor C1 is C1×3 V when a capacitance value of the capacitor C1 is denoted as C1.

In addition, as described above, the ground voltage is applied to the latch control signal line 96. Thus, when a capacitance value of the load capacitor CL of the latch control signal line 96 is denoted by CL, a charge amount QL of the load capacitor CL is CL×0 V.

FIG. 5B illustrates a state of the potential Vlat of the latch control signal line 96 when the level of the first control signal Vsw1 is Low. Because the level of the first control signal Vsw1 is Low, the first switch SW1 is in the ON state. Thus, the capacitor C1 and the latch control signal line 96 are electrically connected. At this time, the charge of the capacitor C1 and the charge of the load capacitor CL of the latch control signal line 96 move depending on a ratio of the capacitance values of the capacitors.

As a result of charge movement, the potential Vlat of the latch control signal line 96 is (Q1+QL)/(C1+CL). In this example, the capacitance value of the capacitor C1 is equal to the capacitance value of the load capacitor CL of the latch control signal line 96. Thus, the charge moves so that the charge amount Q1 of the capacitor C1 is equal to the charge amount QL of the load capacitor CL. Thereby, the potential Vlat of the latch control signal line 96 becomes 1.5 V.

Among the components in the solid-state imaging apparatus 100, the vertical scanning circuit 5, the horizontal scanning circuit 6, and the timing control section 7 are not essential components for obtaining characteristic effects of the solid-state imaging apparatus 100. In addition, among the components in the ADC 9, the counter 94 is not an essential component for obtaining the characteristic effects of the solid-state imaging apparatus 100.

According to this embodiment, an AD converter includes: the reference signal generation section 3 configured to generate a reference signal RAMP that increases or decreases with the passage of time; the comparator 91 configured to compare an analog signal (pixel signal Vpix) with the reference signal RAMP and generate a comparison signal at a timing at which the reference signal RAMP satisfies a predetermined condition with respect to the analog signal; the clock generation section 4 configured to generate a plurality of clock signals CK0 to CK3 having different phases from each other; the latch section 93 having the plurality of latch units 95 corresponding to the plurality of clock signals CK0 to CK3, each of the plurality of latch units 95 being configured to latch one corresponding clock signal of the plurality of clock signals CK0 to CK3; the capacitor C1 to which a first voltage (voltage VDD30) is applied; the latch control signal line 96 to which a second voltage (ground voltage) less than the first voltage is applied and which is connected to the plurality of latch units 95; the first switch SW1 configured to control an electrical connection between the capacitor C1 and the latch control signal line 96 based on a control signal (first control signal Vsw1); and the selection circuit 92 configured to output the control signal for electrically connecting the capacitor C1 to the latch control signal line 96, only when the comparison signal Vco has been generated. A third voltage (voltage VDD15) less than the first voltage and greater than the second voltage is applied as a power supply voltage to the plurality of latch units 95. When the capacitor C1 and the latch control signal line 96 are electrically connected, a potential of the latch control signal line 96 becomes greater than or equal to the third voltage. Only when the electrical connection between the capacitor C1 and the latch control signal line 96 is disconnected, the first voltage is applied to the capacitor C1 and the second voltage is applied to the latch control signal line 96. When the potential of the latch control signal line 96 becomes greater than or equal to the third voltage, the plurality of latch units 95 latch the plurality of clock signals CK0 to CK3.

In addition, according to this embodiment, the solid-state imaging apparatus 100 includes: the pixel section 1 in which the plurality of pixels 8, each of which has a photoelectric conversion element and outputs the pixel signal Vpix, are disposed in the matrix; and the above-described AD converter (the reference signal generation section 3, the clock generation section 4, and the ADC 9). The configuration of the AD converter excluding the reference signal generation section 3 and the clock generation section 4 are provided for one or more columns of the array of the plurality of pixels 8.

In this embodiment, the selection circuit 92 becomes a load of the comparator 91. The selection circuit 92 can be constituted of only one element (inverter circuit 97). Thus, it is possible to reduce the load of the comparator 91 as compared to when the plurality of latch units 95 become the load of the comparator 91. Because the comparator 91 need not drive a large load, a large current does not flow at the timing at which the comparison signal Vco is inverted.

In addition, the voltage VDD30 and the ground voltage are applied only when the electrical connection between the capacitor C1 and the latch control signal line 96 is disconnected. That is, the voltage VDD30 and the ground voltage are electrically disconnected from the latch control signal line 96 when the capacitor C1 and the latch control signal line 96 are electrically connected. The voltage of the latch control signal line 96 can change from the ground voltage to a voltage greater than or equal to the power supply voltage of the plurality of latch units 95 by charge movement between the load capacitor CL and the capacitor C1. Thus, it is possible to prevent a current which flows when the capacitor C1 and the latch control signal line 96 are electrically connected from flowing through the ADC 9 of another column.

From the above, it is possible to reduce the influence of the current flowing through the ADC 9 on the power supply voltage of the ADC 9 of the other column. That is, it is possible to reduce a deviation in the latch timing due to a change in the power supply voltage. Therefore, it is possible to obtain a good image by which an error by AD conversion is reduced.

The first switch SW1 is disposed between the selection circuit 92 and the plurality of latch units 95. It is preferable that a distance between the first switch SW1 and the selection circuit 92 be less than a distance between the latch unit 95 closest to the selection circuit 92 (the latch unit 95 to which the clock signal CK3 is input in FIG. 2) among the plurality of latch units 95 and the selection circuit 92. Thereby, it is possible to shorten the wiring between the selection circuit 92 and the first switch SW1. That is, it is possible to reduce the current which flows depending on the switching operation of the first switch SW1. Therefore, it is possible to further reduce the influence of the current flowing through the ADC 9 on the power supply voltage of the ADC 9 of the other column. In order to further reduce the distance between the first switch SW1 and the selection circuit 92, it is desirable that a sum of the distance between the first switch SW1 and the selection circuit 92 and the distance between the first switch SW1 and the latch unit 95 closest to the selection circuit 92 among the plurality of latch units 95 be as close as possible to the distance between the selection circuit 92 and the latch unit 95 closest to the selection circuit 92 among the plurality of latch units 95.

The capacitance value of the capacitor C1 need not be the same as the capacitance value of the load capacitor CL of the latch control signal line 96. It is only necessary to set the capacitance value of the capacitor C1 to a value in which the potential Vlat of the latch control signal line 96 is greater than or equal to the voltage VDD15 when the capacitor C1 and the latch control signal line 96 have been electrically connected. Specifically, it is only necessary for the capacitance value of the capacitor C1 to be a value greater than or equal to the capacitance value of the load capacitor CL of the latch control signal line 96. When the power supply voltage of the plurality of latch units 95 is less than the voltage VDD15, it is possible to further reduce the capacitance value of the capacitor C1.

Figure 6:
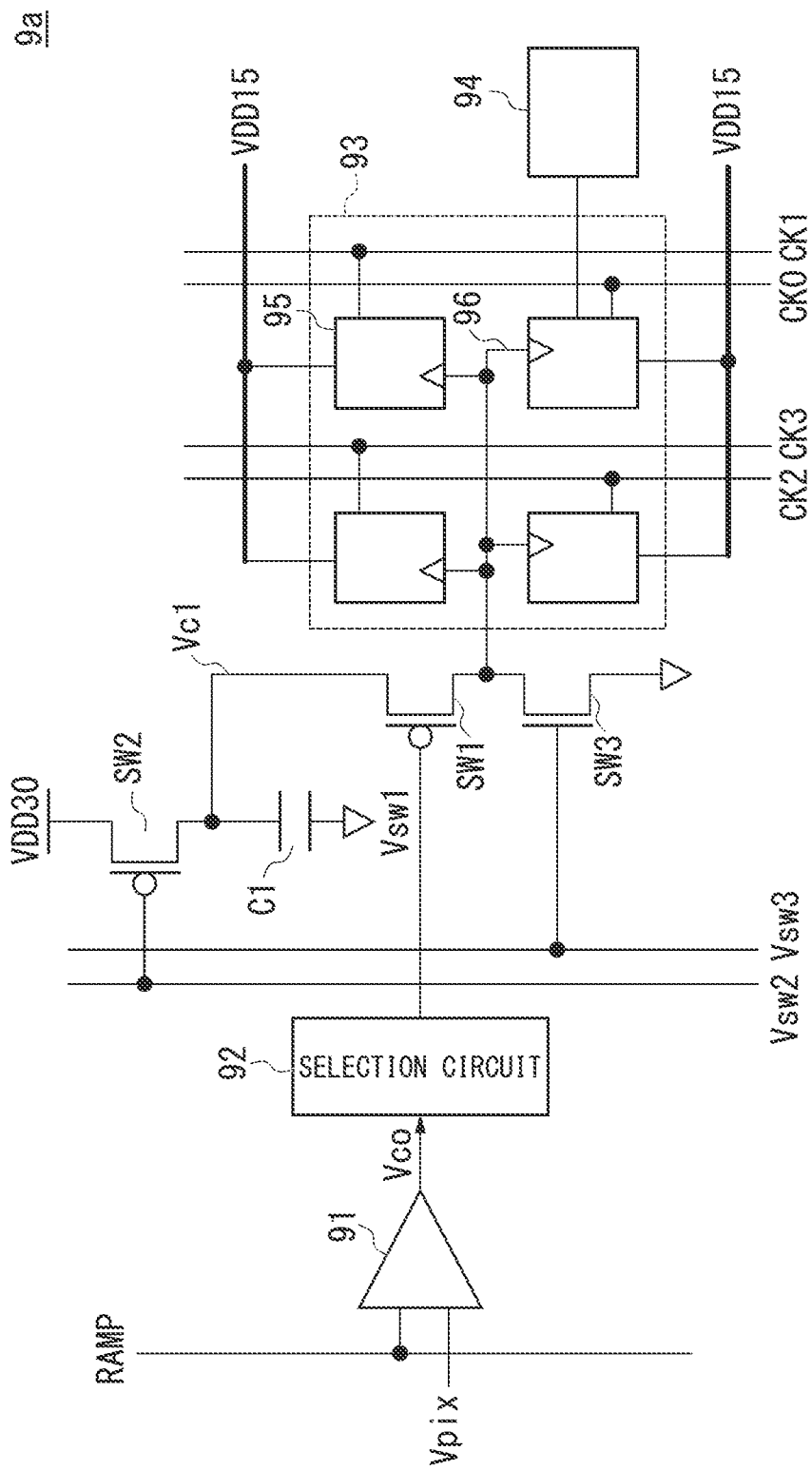
FIG. 6 is a block diagram illustrating a configuration example of the ADC provided in the solid-state imaging apparatus according to the embodiment of the present invention.

The layout of the plurality of latch units 95 is not limited to the layout illustrated in FIG. 2. The ADC 9 may be an ADC 9a illustrated in FIG. 6. In the ADC 9a, the plurality of latch units 95 are disposed symmetrically around the latch control signal line 96. In terms of points other than those mentioned above, the ADC 9a is similar to the ADC 9 illustrated in FIG. 2.

In addition, the number of the latch units 95 is not limited to 4. It is only necessary for the number of the latch units 95 to be two or more. In order to process a binary number, it is desirable that the number of the latch units 95 be to the power of 2. In this case, it is easy for a subsequent-stage digital circuit (an image processing circuit (not illustrated) or the like) to process a digital signal.

Figure 7A:
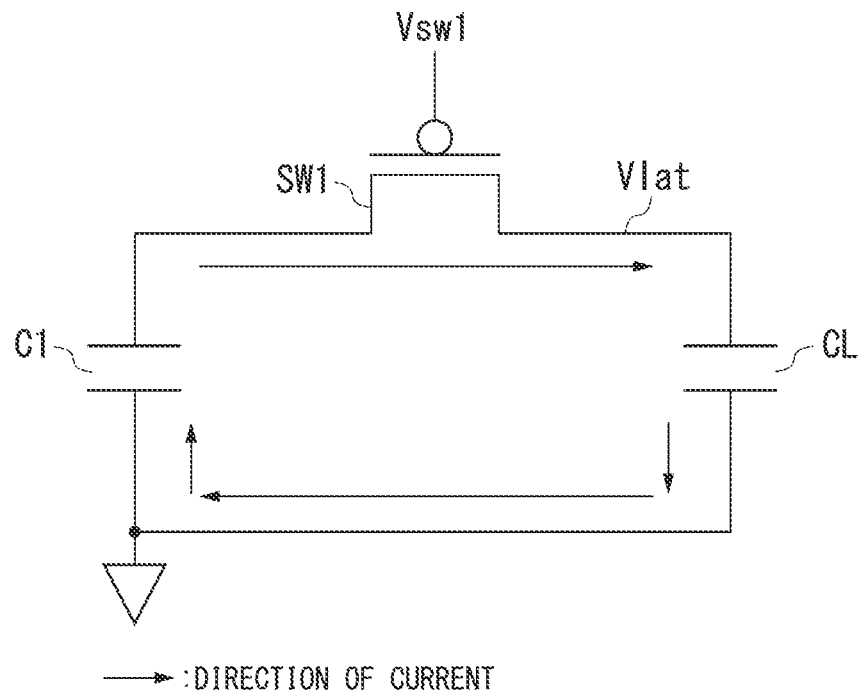
FIG. 7A is a circuit diagram illustrating a connection between each of a capacitor and a load capacitor and a ground terminal in the ADC provided in the solid-state imaging apparatus according to the embodiment of the present invention.
Figure 7B:
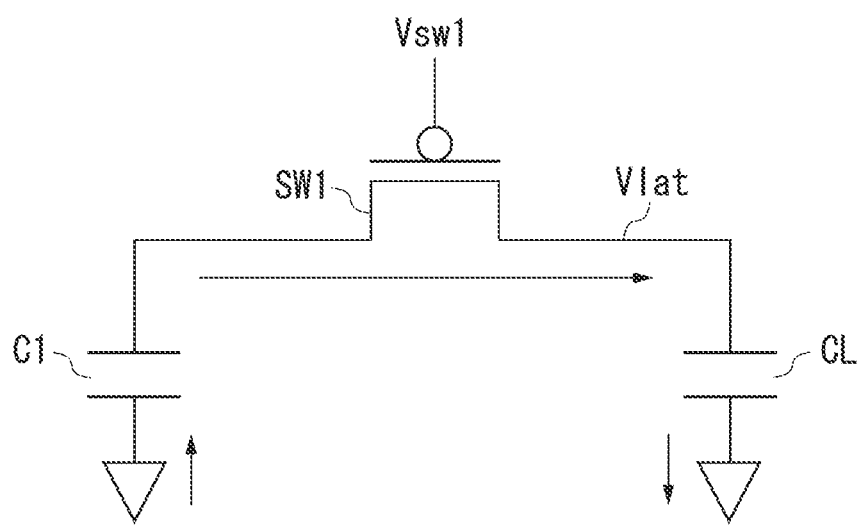
FIG. 7B is a circuit diagram illustrating a connection between each of the capacitor and the load capacitor and a ground terminal in the ADC provided in the solid-state imaging apparatus according to the embodiment of the present invention.

In addition, the capacitor C1 and the load capacitor CL may be configured to be commonly connected to the ground terminal FIGS. 7A and 7B illustrate connections between each of the capacitor C1 and the load capacitor CL and the ground terminal. In FIG. 7A, the capacitor C1 and the load capacitor CL are commonly connected to the ground terminal. As illustrated in FIG. 7A, the current though the first switch SW1 flows to the capacitor C1 through the load capacitor CL. Thus, the current which flows through the ground terminal is reduced.

In FIG. 7B, the capacitor C1 and the load capacitor CL are connected to different ground terminals. Thus, the current flows between the capacitor C1 and the ground terminal and the current flows between the load capacitor CL and the ground terminal. When the current flows through the ground terminal, the ground voltage changes due to wiring resistance of the ground wiring.

By commonly connecting the capacitor C1 and the load capacitor CL to the ground terminal as illustrated in FIG. 7A, it is possible to reduce a current which flows through the ground terminal at the timing at which the first switch SW1 connects the capacitor C1 and the latch control signal line 96. Thereby, it is possible to reduce a change in the ground voltage in addition to a change in the power supply voltage. That is, it is possible to obtain a better image. In order to commonly connect the capacitor C1 and the load capacitor CL to the ground terminal as illustrated in FIG. 7A, the latch control signal line 96 may be applied to a guard ring by the ground wiring to which one end of the capacitor C1 is connected or the like. The load capacitor CL is formed between the ground wiring by which the latch control signal line 96 is applied to the guard ring and the latch control signal line 96.

Next, a modified example of this embodiment will be described.

First Modified Example

Figure 8:
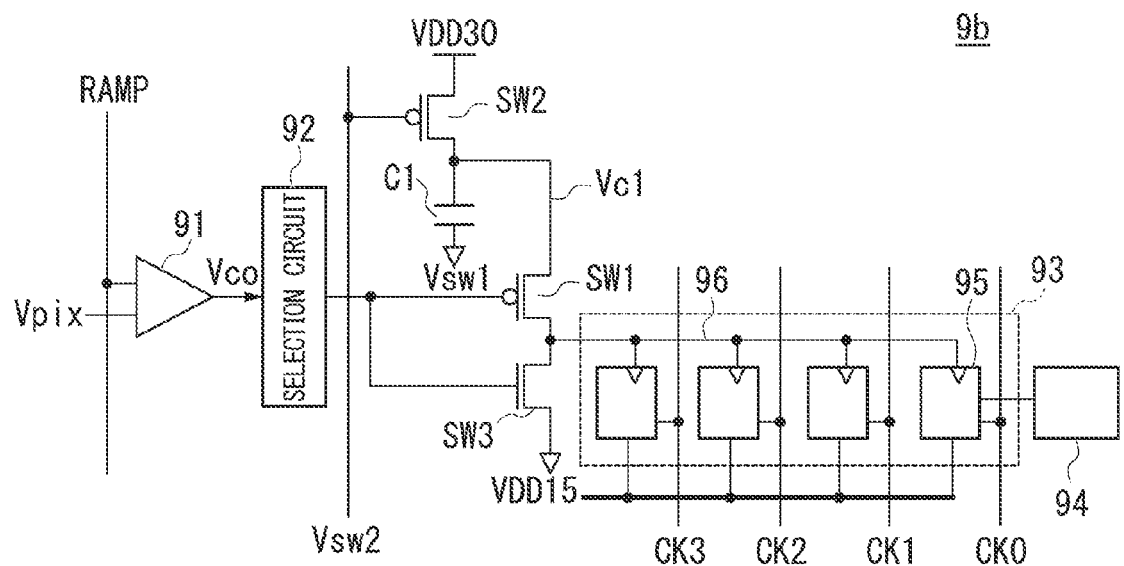
FIG. 8 is a block diagram illustrating a configuration example of an ADC provided in a solid-state imaging apparatus according to a first modified example of the embodiment of the present invention.

FIG. 8 illustrates a configuration example of an ADC 9b according to the first modified example. The ADC 9 illustrated in FIG. 2 may be the ADC 9b illustrated in FIG. 8. In the ADC 9b, the third switch SW3 is controlled by the first control signal Vsw1 from the selection circuit 92.

The gate of the third switch SW3 is connected to the selection circuit 92. The first control signal Vsw1 output from the selection circuit 92 is input to the gate of the third switch SW3. When the level of the first control signal Vsw1 is High, the third switch SW3 is in the ON state and electrically connects the ground voltage and the latch control signal line 96. In addition, when the level of the first control signal Vsw1 is Low, the third switch SW3 is in the OFF state and disconnects the electrical connection between the ground voltage and the latch control signal line 96. In terms of points other than those mentioned above, the ADC 9b is similar to the ADC 9 illustrated in FIG. 2.

Figure 9:
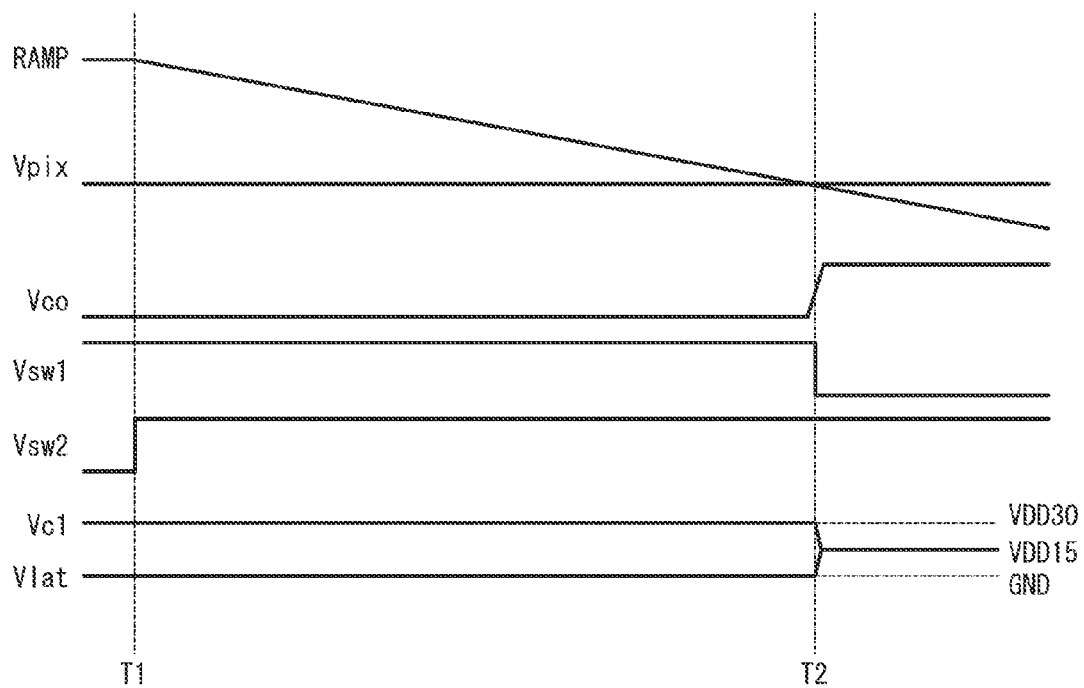
FIG. 9 is a timing chart illustrating an operation example of the ADC provided in the solid-state imaging apparatus according to the first modified example of the embodiment of the present invention.

FIG. 9 illustrates an operation example of the ADC 9b. In FIG. 9, the reference signal RAMP, the pixel signal Vpix, the comparison signal Vco, the first control signal Vsw1, the second control signal Vsw2, the voltage Vc1 of the first end of the capacitor C1, and the potential Vlat of the latch control signal line 96 are illustrated. The horizontal direction of FIG. 9 represents time. In addition, the vertical direction of FIG. 9 represents a voltage.

The level of the first control signal Vsw1 output by the selection circuit 92 is the High level from the timing T1 to the timing T2. Thus, the third switch SW3 is in the ON state and electrically connects the ground voltage and the latch control signal line 96. Thereby, because the ground voltage is applied to the latch control signal line 96, the potential Vlat of the latch control signal line 96 is the ground voltage GND.

At the timing T2, the selection circuit 92 outputs the first control signal Vsw1 of the Low level. Thus, the first switch SW1 is in the ON state and electrically connects the capacitor C1 and the latch control signal line 96. Simultaneously, the third switch SW3 is in the OFF state and disconnects the electrical connection between the ground voltage and the latch control signal line 96.

At this time, the potential Vlat of the latch control signal line 96 changes from the ground voltage GND to an intermediate voltage, that is, the voltage VDD15, between the voltage Vc1 of the first end of the capacitor C1, that is, the voltage VDD30, and the ground voltage GND. In terms of points other than those mentioned above, the operation is similar to the operation illustrated in FIG. 4.

In the ADC 9b, the latch control signal line 96 is not floating during a period from the start of the comparison by the comparator 91 to the inversion of the comparison signal Vco. That is, the latch control signal line 96 has any connection. Thus, it is possible to increase resistance against noise. That is, it is possible to prevent the latch section 93 from erroneously operating even when the noise is superimposed on the latch control signal line 96. Likewise, at the timing T2 at which the comparison signal Vco is inverted, the second switch SW2 may be configured to change from the OFF state to the ON state. Thereby, during the period from the start of the comparison by the comparator 91 to the inversion of the comparison signal Vco, the capacitor C1 is not floating. That is, it is possible to prevent the latch section 93 from erroneously operating even when the noise is superimposed on the capacitor C1.

Second Modified Example

Figure 10:
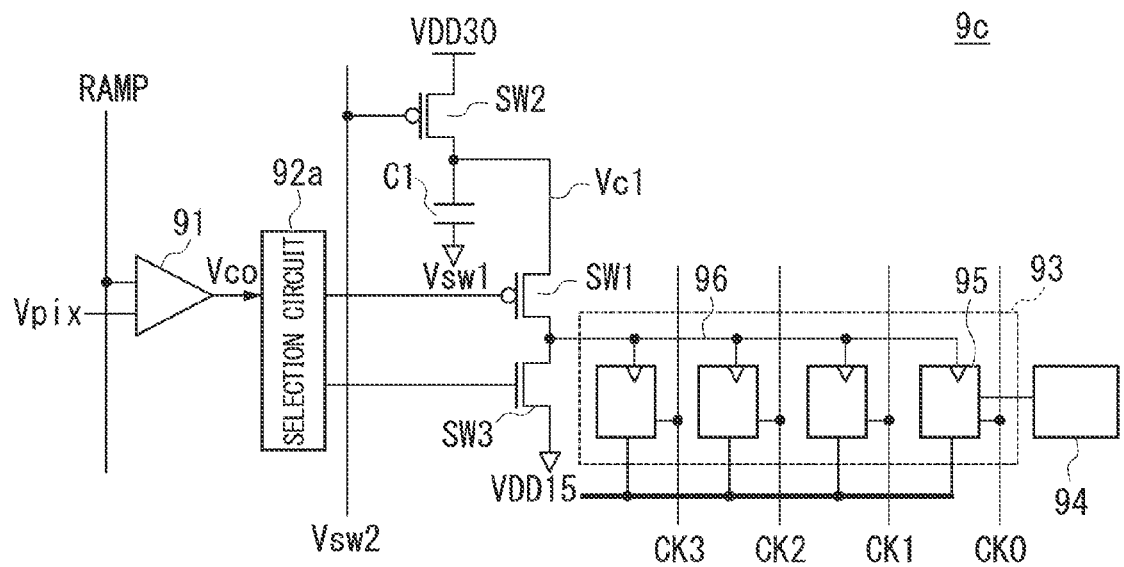
FIG. 10 is a block diagram illustrating a configuration example of an ADC provided in a solid-state imaging apparatus according to a second modified example of the embodiment of the present invention.

FIG. 10 illustrates a configuration example of an ADC 9c according to the second modified example. The ADC 9 illustrated in FIG. 2 may be the ADC 9c illustrated in FIG. 10. In the ADC 9c, a selection circuit 92a is provided in place of the selection circuit 92. The selection circuit 92a generates the first control signal Vsw1 for controlling the first switch SW1 and the third control signal Vsw3 for controlling the third switch SW3 based on the comparison signal Vco output from the comparator 91.

Figure 11:
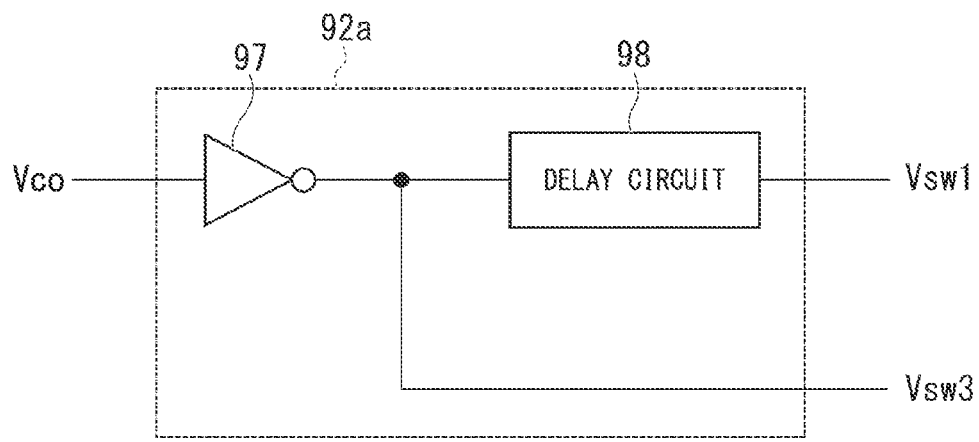
FIG. 11 is a circuit diagram illustrating a configuration example of a selection circuit in the ADC provided in the solid-state imaging apparatus according to the second modified example of the embodiment of the present invention.

FIG. 11 illustrates a configuration example of the selection circuit 92a. As illustrated in FIG. 11, the selection circuit 92a has an inverter circuit 97 and a delay circuit 98. The inverter circuit 97 generates the third control signal Vsw3 by inverting the comparison signal Vco and outputs the generated third control signal Vsw3. The delay circuit 98 delays the generated third control signal Vsw3 output from the inverter circuit 97 by a predetermined amount and outputs the delayed signal as the first control signal Vsw1.

Figure 12:
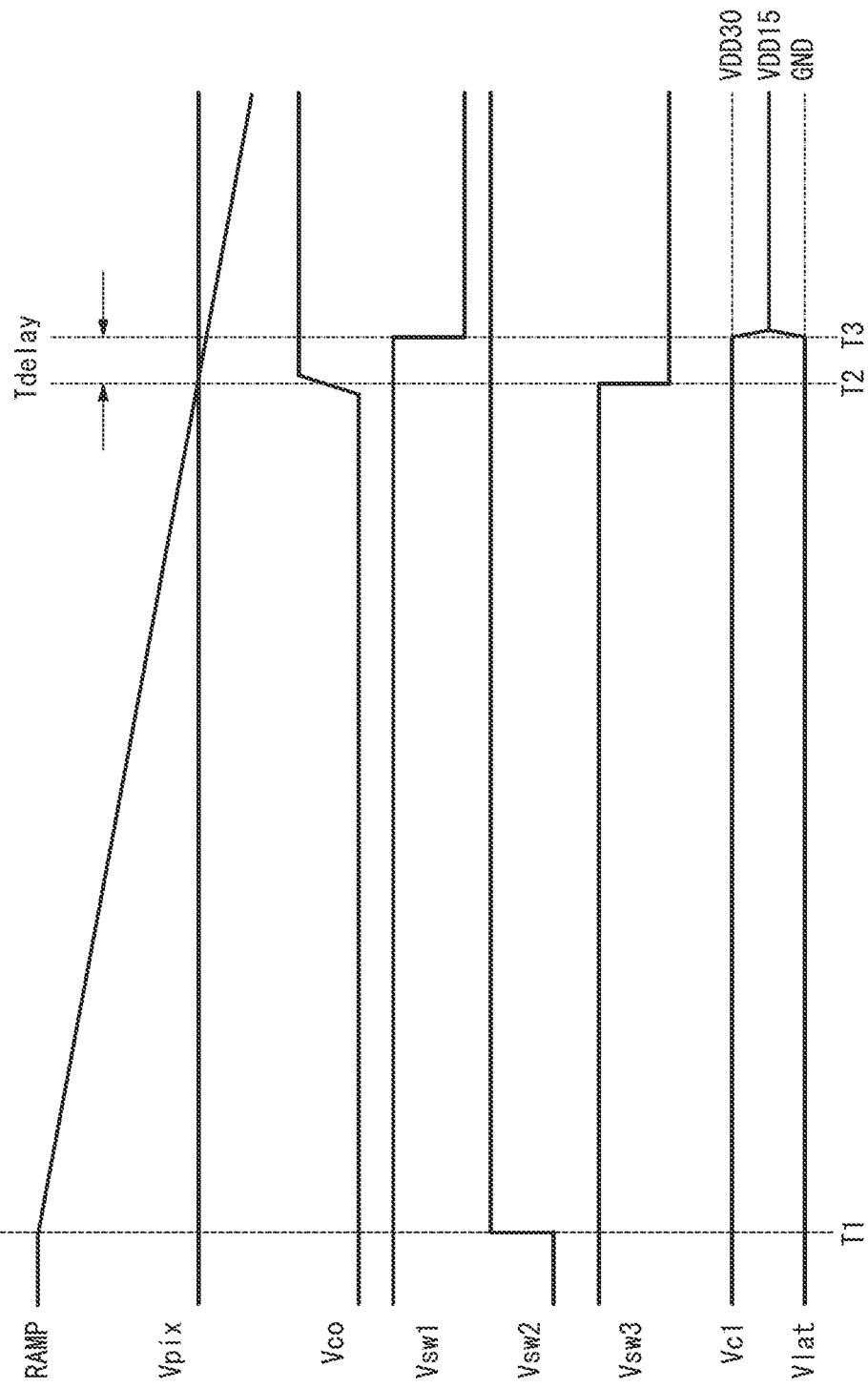
FIG. 12 is a timing chart illustrating an operation example of the ADC provided in the solid-state imaging apparatus according to the second modified example of the embodiment of the present invention.
Figure 13:
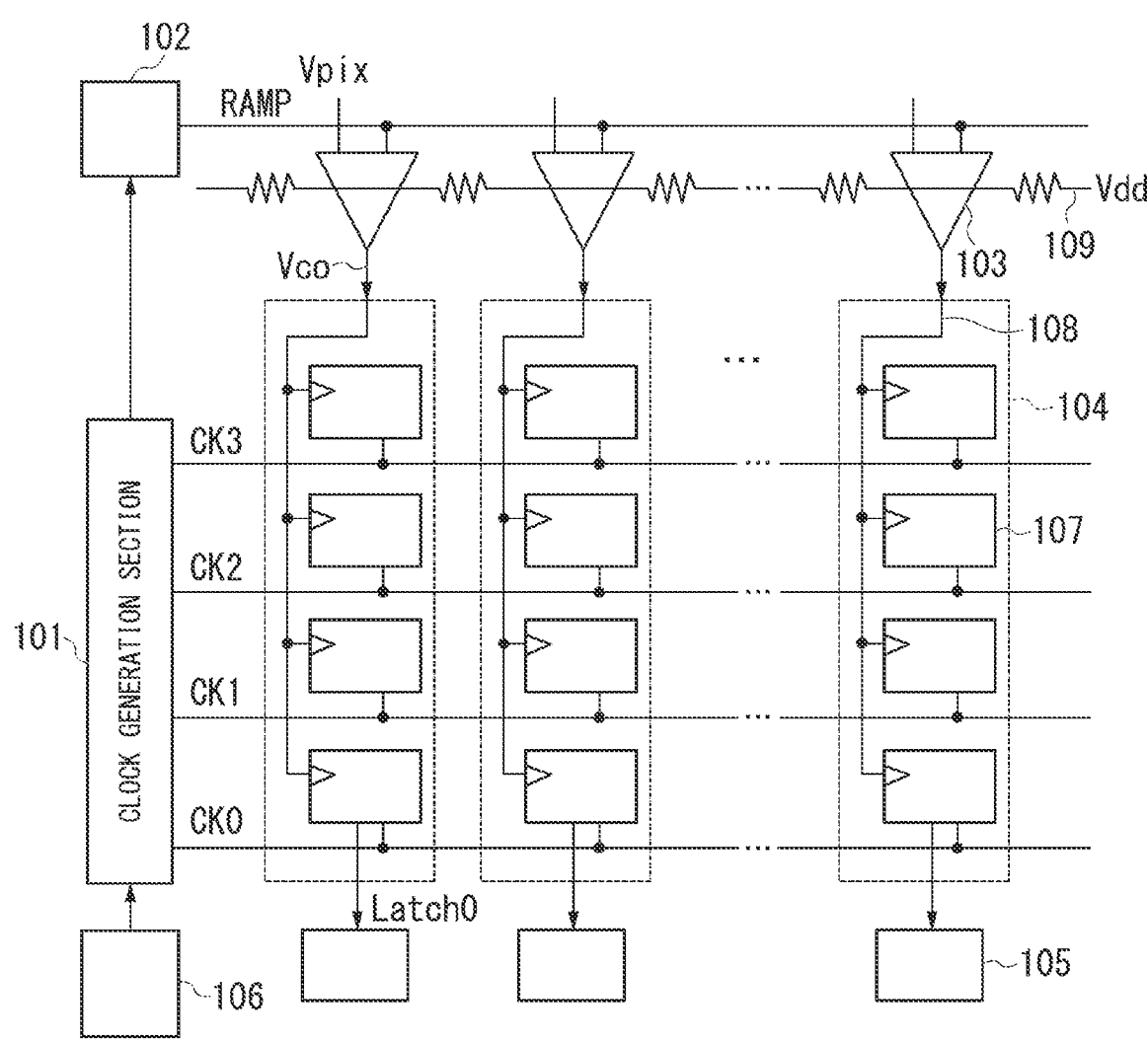
FIG. 13 is a block diagram illustrating a configuration example of a conventional ADC.

FIG. 12 illustrates an operation example of the ADC 9c. In FIG. 12, the reference signal RAMP, the pixel signal Vpix, the comparison signal Vco, the first control signal Vsw1, the second control signal Vsw2, the third control signal Vsw3, the voltage Vc1 of the first end of the capacitor C1, and the potential Vlat of the latch control signal line 96 are illustrated. The horizontal direction of FIG. 12 represents time. In addition, the vertical direction of FIG. 12 represents a voltage.

When the level of the reference signal RAMP is less than the level of the pixel signal Vpix at the timing T2, that is, when the magnitude relationship of levels of the pixel signal Vpix and the reference signal RAMP is switched, the comparator 91 outputs the comparison signal Vco of the High level. That is, the level of the comparison signal Vco changes from the Low level to the High level.

Thereby, the selection circuit 92a outputs the third control signal Vsw3 of the Low level. Thus, the third switch SW3 is in the OFF state and disconnects the electrical connection between the ground voltage and the latch control signal line 96. Further, at the timing T3 at which a predetermined delay time Tdelay has elapsed, the selection circuit 92a outputs the first control signal Vsw1 of the Low level. Thus, the first switch SW1 is in the ON state and electrically connects the capacitor C1 and the latch control signal line 96. At this time, the potential Vlat of the latch control signal line 96 changes from the ground voltage GND to an intermediate voltage, that is, the voltage VDD15, between the voltage Vc1 of the first end of the capacitor C1, that is, the voltage VDD30, and the ground voltage GND. In terms of points other than those mentioned above, the operation is similar to the operation illustrated in FIG. 4.

In the ADC 9c, the first switch SW1 and the third switch SW3 are in the ON state at different timings. Thereby, it is possible to reduce a current which flows through the first switch SW1 and the third switch SW3. Thus, it is possible to obtain a good image by which an error by AD conversion is reduced.

While preferred embodiments of the present invention have been described in detail above with reference to the drawings, specific configurations are not limited to these embodiments, and design changes, etc. not departing from the spirit and scope of the present invention are also included. Accordingly, the invention is not to be considered as being limited by the foregoing description, and is only limited by the scope of the appended claims.

What is claimed is:

1. An analog-to-digital (AD) converter comprising:
    a reference signal generation section configured to generate a reference signal that increases or decreases with a passage of time;
    a comparator configured to compare an analog signal with the reference signal and generate a comparison signal at a timing at which the reference signal satisfies a predetermined condition with respect to the analog signal;
    a clock generation section configured to generate a plurality of clock signals having different phases from each other;
    a latch section having a plurality of latch units corresponding to the plurality of clock signals, each of the plurality of latch units being configured to latch one corresponding clock signal of the plurality of clock signals;
    a capacitor to which a first voltage is applied;
    a latch control signal line to which a second voltage less than the first voltage is applied and which is connected to the plurality of latch units;
    a first switch configured to control an electrical connection between the capacitor and the latch control signal line based on a control signal; and
    a selection circuit configured to output the control signal for electrically connecting the capacitor to the latch control signal line, only when the comparison signal has been generated, wherein
    a third voltage less than the first voltage and greater than the second voltage is applied as a power supply voltage to the plurality of latch units,
    when the capacitor is electrically connected to the latch control signal line, a potential of the latch control signal line becomes greater than or equal to the third voltage,
    only when the electrical connection between the capacitor and the latch control signal line is disconnected, the first voltage is applied to the capacitor and the second voltage is applied to the latch control signal line, and
    when the potential of the latch control signal line becomes greater than or equal to the third voltage, the plurality of latch units latch the plurality of clock signals.

2. The AD converter according to claim 1, wherein a distance between the first switch and the selection circuit is less than a distance between a latch unit closest to the selection circuit among the plurality of latch units and the selection unit.

3. The AD converter according to claim 1, further comprising:
    a second switch configured to control an electrical connection between the first voltage and the capacitor; and
    a third switch configured to control an electrical connection between the second voltage and the latch control signal line.

4. The AD converter according to claim 1, wherein the number of the latch units is set to be a power of 2.

5. A solid-state imaging apparatus comprising:
    a pixel section in which a plurality of pixels, each of which has a photoelectric conversion element and outputs a pixel signal, are disposed in a matrix; and
    the AD converter according to claim 1, wherein
    a configuration of the AD converter excluding the reference signal generation section and the clock generation section is provided for every one or more columns of an array of the plurality of pixels.

\* \* \* \* \*